US009610651B2

(12) United States Patent
Martinsen

(10) Patent No.: US 9,610,651 B2
(45) Date of Patent: Apr. 4, 2017

(54) SQUARE PULSE LASER LIFT OFF

(71) Applicant: nLIGHT Photonics Corporation, Vancouver, WA (US)

(72) Inventor: Robert J. Martinsen, West Linn, OR (US)

(73) Assignee: nLIGHT, Inc., Vancouver, WA (US)

( * ) Notice: Subject to any disclaimer, the term of this patent is extended or adjusted under 35 U.S.C. 154(b) by 209 days.

(21) Appl. No.: 14/632,813

(22) Filed: Feb. 26, 2015

(65) Prior Publication Data
US 2015/0239063 A1     Aug. 27, 2015

Related U.S. Application Data

(60) Provisional application No. 61/945,115, filed on Feb. 26, 2014.

(51) Int. Cl.
B23K 26/08     (2014.01)
B23K 26/073    (2006.01)
B23K 26/00     (2014.01)
B23K 26/06     (2014.01)
B23K 26/082    (2014.01)
B23K 26/362    (2014.01)
B23K 26/40     (2014.01)
H01L 33/00     (2010.01)
B23K 103/00    (2006.01)

(52) U.S. Cl.
CPC ...... *B23K 26/0732* (2013.01); *B23K 26/0006* (2013.01); *B23K 26/0054* (2013.01); *B23K 26/0604* (2013.01); *B23K 26/0608* (2013.01); *B23K 26/082* (2015.10); *B23K 26/362* (2013.01); *B23K 26/40* (2013.01); *B23K 2203/50* (2015.10); *B23K 2203/56* (2015.10); *H01L 33/0079* (2013.01)

(58) Field of Classification Search
CPC .............. B23K 26/0732; B23K 26/082; B23K 26/0006; B23K 26/0054; B23K 26/0608; B23K 26/362; B23K 26/40; B23K 2203/50; B23K 2203/56
USPC ...................................... 219/121.73
See application file for complete search history.

(56) References Cited

U.S. PATENT DOCUMENTS 7,754,511 B2   7/2010   Wen et al.
8,395,082 B2   3/2013   Zhang et al.
8,946,098 B2   2/2015   Wagner
8,986,497 B2   3/2015   Sercel et al.

*Primary Examiner* — Brian Jennison
(74) *Attorney, Agent, or Firm* — Klarquist Sparkman, LLP

(57) ABSTRACT

A laser lift-off method includes generating a plurality of solid state laser pulses, converting the plurality of solid state laser pulses to an ultraviolet frequency, adjusting the transverse spatial intensity profile of the plurality of laser pulses across perpendicular transverse axes to be rectangular in shape with the shape along each transverse axis corresponds to a super-Gaussian of order eight or higher, and scanning the plurality of laser pulses across the target along a direction parallel to one of the transverse axes in order to produce laser lift-off on the target. Systems for laser lift-off are also disclosed.

20 Claims, 7 Drawing Sheets

SQUARE PULSE LASER LIFT OFF

CROSS REFERENCE TO RELATED APPLICATION

This application claims the benefit of U.S. Provisional Application No. 61/945,115, filed on Feb. 26, 2014, which is hereby incorporated by reference in its entirety.

FIELD

The disclosure pertains to laser lift off.

BACKGROUND

Laser lift-off techniques are often used in the fabrication of various microelectronic devices, including flexible displays, flat panels, and semiconductor wafers. Laser lift-off typically involves removing or isolating one or more selected material layers by damaging, vaporizing, or otherwise altering an underlying sacrificial layer with high energy laser energy. For example, conventional laser lift-off can be performed with an excimer laser by generating an excimer (UV) laser line beam pulses having the requisite laser lift-off pulse parameters and scanning the line pulses across the target surface. However, even with the relatively superior performance with excimer-based products, capital cost and cost of ownership are onerous.

In order to make the laser lift-off process more accessible by reducing cost, techniques have been proposed where a solid state laser is used instead of an excimer laser. Some lower cost solid state laser-based laser lift-off system designs have attempted to utilize a smaller laser pulse spot instead of a laser pulse line. The solid state laser pulse spot is raster scanned to process the area or pattern where lift-off is to occur. Unfortunately, such attempts have not met with success. The lift-off targets are prone to "mura," i.e., process non-uniformity, including moire patterns and other unevenness or non-uniformity that is generally unacceptable. Furthermore, processing (or "takt") times tend to be larger than line based approaches. Consequently, the lower cost solid state laser approaches have been all but scrapped by industry. Thus, despite efforts to achieve a solid-state laser scanning laser lift-off system that is free of mura and poor takt times, there remains a need for systems and methods without these attendant drawbacks.

The foregoing and other objects, features, and advantages will become more apparent from the following detailed description, which proceeds with reference to the accompanying figures which are not necessarily drawn to scale.

SUMMARY

According to one aspect, a laser lift-off method includes generating a plurality of solid state laser pulses, converting the plurality of solid state laser pulses to an ultraviolet frequency, adjusting the transverse spatial intensity profile of the plurality of laser pulses across perpendicular transverse axes to be rectangular in shape with the shape along each transverse axis corresponds to a super-Gaussian of order eight or higher, and scanning the plurality of laser pulses across the target along a direction parallel to one of the transverse axes in order to produce laser lift-off on the target.

According to another aspect, a system for causing laser lift-off on a target includes a pulsed solid state laser situated to produce laser pulses having laser pulse parameters selected for laser lift-off, frequency converter situated to receive the laser pulses and to convert the frequency of the laser pulses, beam shaping optics situated to receive the laser pulses and to adjust the transverse intensity profile of the laser pulses across perpendicular transverse axes such that the shape of the profile across each transverse axis corresponds to a super-Gaussian of order eight or higher, and scanning optics situated to direct the spatially adjusted laser pulses to the target along a direction parallel to one of the transverse axes in order to cause laser lift-off on the target.

The foregoing and other objects, features, and advantages of the disclosed technology will become more apparent from the following detailed description, which proceeds with reference to the accompanying figures.

DETAILED DESCRIPTION

Figure 1A:
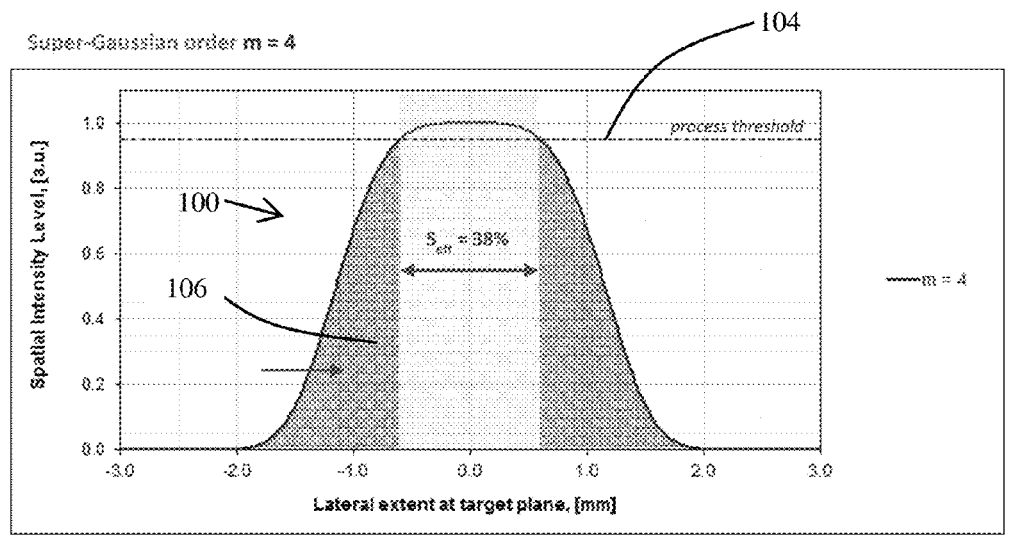
FIG. 1A is a chart of spatial intensity across an example laser pulse.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

As used herein, laser pulses and optical radiation refer to electromagnetic radiation at wavelengths of between about 100 nm and 10 µm, and typically between about 100 nm and 400 nm for ultraviolet, 400 and 700 for visible (e.g., green at 532 nm), and from about 700 to 10 µm or longer for infrared. Examples based on available solid state laser sources generally are associated with wavelengths between about 800 nm and 1700 nm. In some examples, optical radiation is converted from one or more wavelengths to another wavelength or wavelengths through nonlinear frequency harmonic generation, including frequency doubling, sum and difference frequency generation, optical parametric oscillation, or optical parametric amplification. In some examples, propagating optical radiation is referred to as one or more beams having diameters, beam cross-sectional areas, and beam divergences that can depend on beam wavelength and the optical systems used for beam shaping. For convenience, optical radiation is referred to as light in some examples, and need not be at visible wavelengths. Pulse shapes are described which include circular, rectangular, square, top-hat, Gaussian, super-Gaussian, etc. Such shapes generally refer to transverse spatial intensity profiles or distributions across one or more axes, with such transverse spatial axes typically lying perpendicular to each other and mutually perpendicular to an optical axis of propagation.

Previous attempts and approaches to laser lift-off with scanning-spot solid state laser pulse systems failed to recognize important system parameters. Such attempts typically used a circular (or oval) laser pulse spot that is scanned over an area. The laser pulse spot would have a Gaussian intensity distribution across one or more axes and the pulses would be scanned over an area to produce the lift-off effect. Even with substantial overlap from pulse to pulse, mura and moire patterns plague the lift-off result, along with poor processing times to achieve the effect. Moreover, even when the circular spot was made to have a uniform intensity distribution, such as a flat-top intensity distribution, similar undesirable mura was the result. Surprisingly, as the inventor herein has discovered, a square or rectangular pulse with a selected uniformity of spatial intensity distribution should be provided to eliminate the drawbacks of previous approaches.

Figure 8:
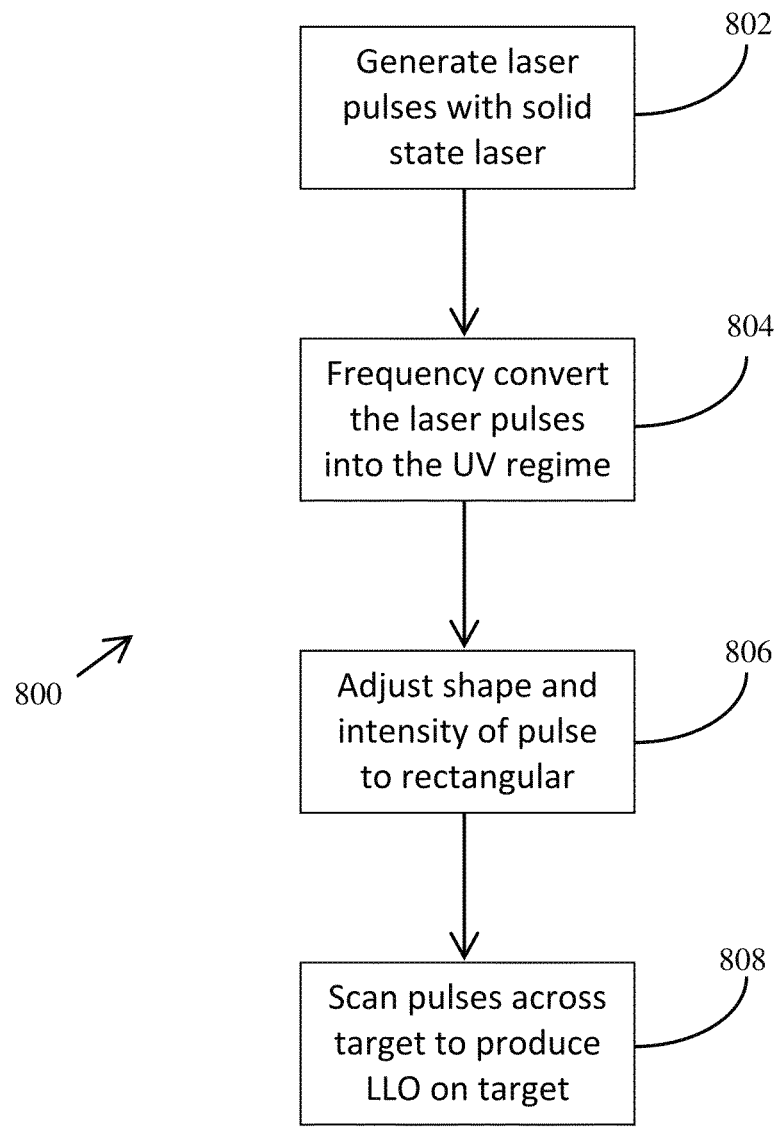
FIG. 8 is a flowchart of a laser lift-off method.

For example, in FIG. 8 a method 800 is disclosed in which at 802 one or more laser pulses are generated using a solid state laser. Suitable laser sources include solid state disk lasers, solid state rod lasers, or other solid state sources. The solid state laser source will typically provide the laser pulses in the infrared spectrum, e.g., at 1030 nm or 1064 nm, and will have laser pulse characteristics selected and provided to effect or to subsequently effect (through one or more pulse changing operations) laser lift-off, including pulse duration, pulse repetition rate, and pulse energy, etc. At 804, the generated laser pulses are frequency converted into the UV regime, for example, by frequency tripling with a non-linear optical medium, since many applications require the UV wavelength for successful lift-off. In some examples, frequency tripling can be achieved using the third-order non-linear susceptibility relation, and in other examples the second order nonlinearity is used. For example, pulses at 1030 nm or 1064 nm are mixed with frequency-doubled light at 515 nm or 532 nm to obtain pulses at 343 nm or 355 nm. It will be appreciated that other wavelengths can be achieved by exploiting different harmonics, laser source wavelengths, and nonlinear optical media.

At 806, the spatial intensity shape of the laser pulse transverse to the direction of propagation is adjusted to form a rectangle or square. For rectangular pulses, the aspect ratio between transverse spatial axes can increase to as much as 5:1, though typically a square 1:1 aspect ratio is preferred. The transverse spatial intensity distribution of the laser pulse is also adjusted to have a selected uniformity across both transverse axes of the square (or rectangle). For example, one such uniformity can be higher than a super-Gaussian intensity distribution of the fourth order. Other distributions can include eighth order, twelfth order, fourteenth order, or higher order super-Gaussians. Uniformities can be achieved through beam shaping, homogenization, refractive, diffractive, or reflective systems, or other approaches that are known in the art of optical beam uniformity. At 808, the pulses are scanned along a line at a selected speed so that pulses may overlap or adjoin in the scan direction. The resulting effect of the scanning of pulses is laser lift-off at the target without mura or other adverse effects typically associated with conventional applications of solid state laser sources to laser lift-off processes.

Figure 7:
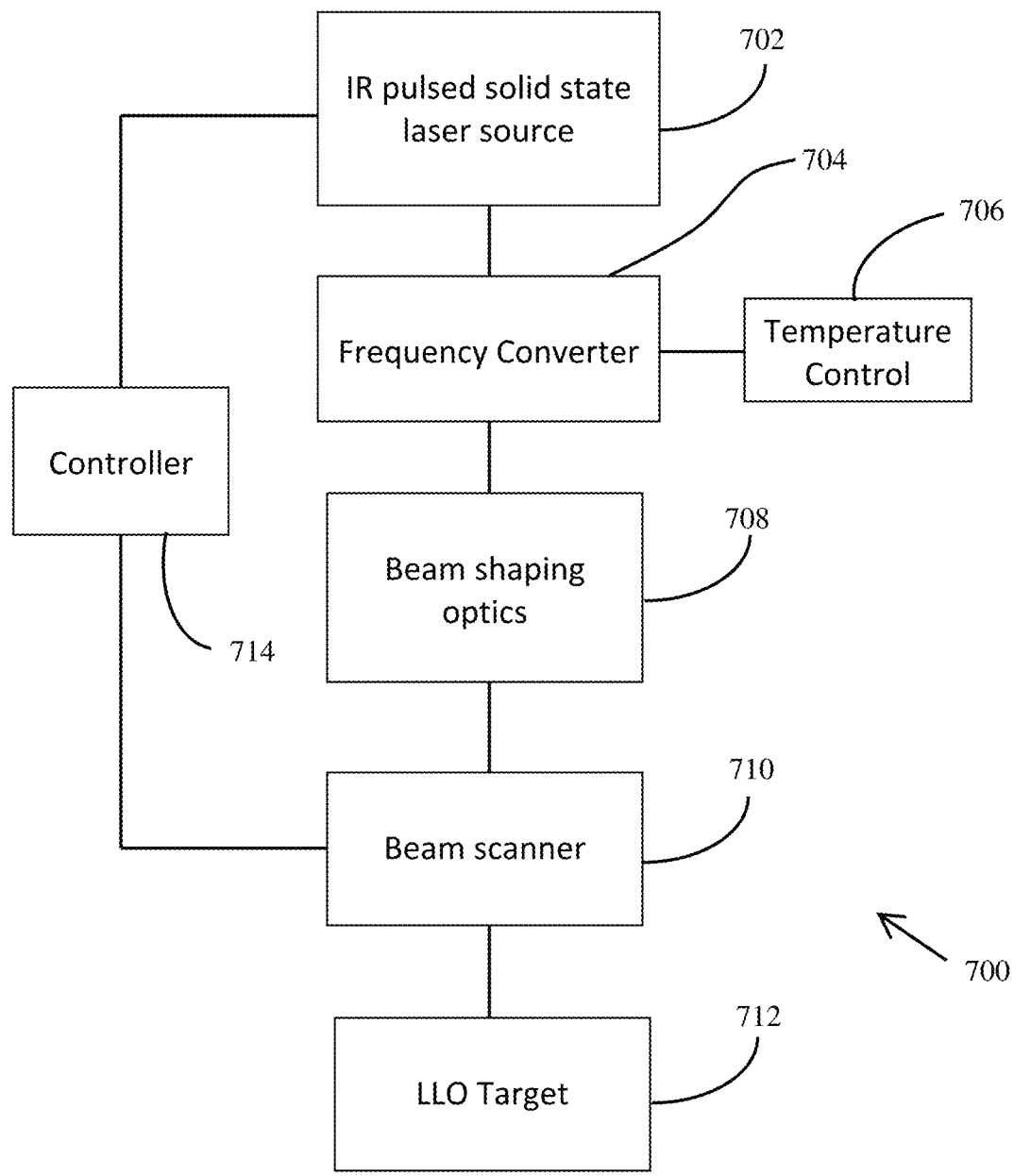
FIG. 7 is a schematic of a laser lift-off system.

In FIG. 7 a schematic is shown for an embodiment of a solid state pulsed laser system 700 for providing square laser pulses to produce laser lift-off at a target. The system includes a pulsed infrared solid state laser source 702, such as a solid state disk laser, for providing a plurality of laser pulses having selected pulse parameters associated with laser lift-off. For example, one such disk-type laser is the TruMicro Series 7000 manufactured by Trumpf Corporation which can generate pulses repetition rates for 5 kHz to 100 kHz, pulse energies of up to 80 mJ, pulse durations of 30 ns. Other solid state sources can also be used. A frequency converter 704 is coupled to the solid state laser source to receive the infrared optical pulses and convert the optical pulses to an ultraviolet wavelength. For example, frequency tripling can be employed to convert optical pulses having a wavelength of around 1064 nm to ultraviolet optical pulses having a wavelength of around 355 nm. Typically the frequency converter uses one or more non-linear optical elements which are temperature controlled, e.g., via temperature control 706, to achieve optimum conversion efficiency.

Figure 5:
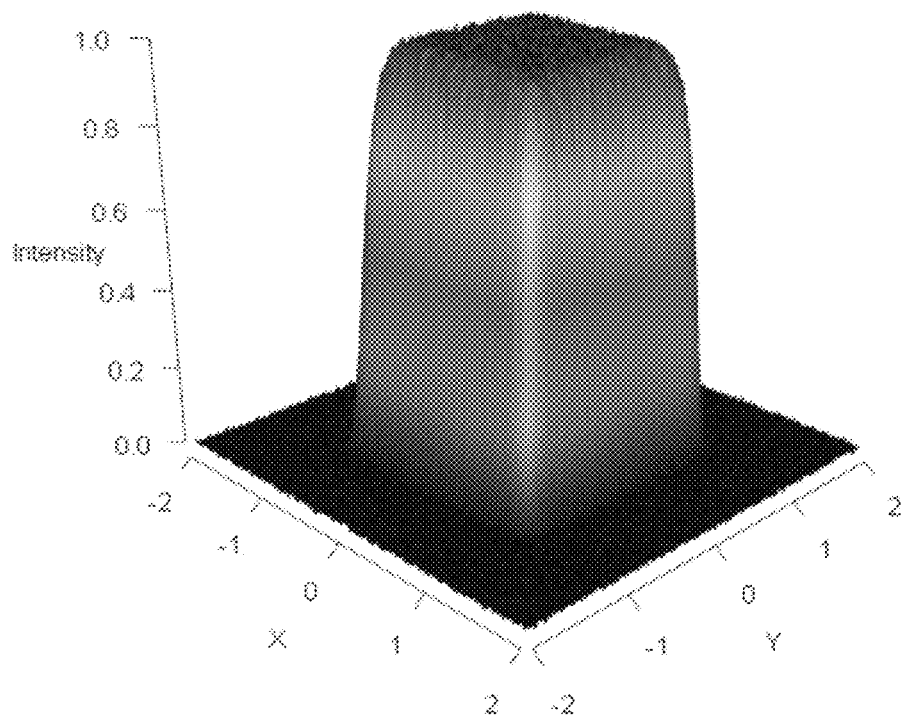
FIG. 5 is a three dimensional intensity plot of a square laser pulse.

Beam shaping optics 708 are coupled to the frequency converter 704 to receive the frequency converted optical pulses and to shape the optical pulses. The optical pulses are typically provided with a circular shape and a lowest order Gaussian intensity distribution though other beam features are possible. The circular shape or other input shape is converted to a rectangular or square shape with the beam shaping optics 708. Also, the spatial intensity distribution across both transverse axes of the optical pulse is modified to become uniform using one or more ways known in the art of beam shaping. An optically modeled example of a square pulse with a uniform intensity distribution is shown in FIG. 5.

Figure 6:
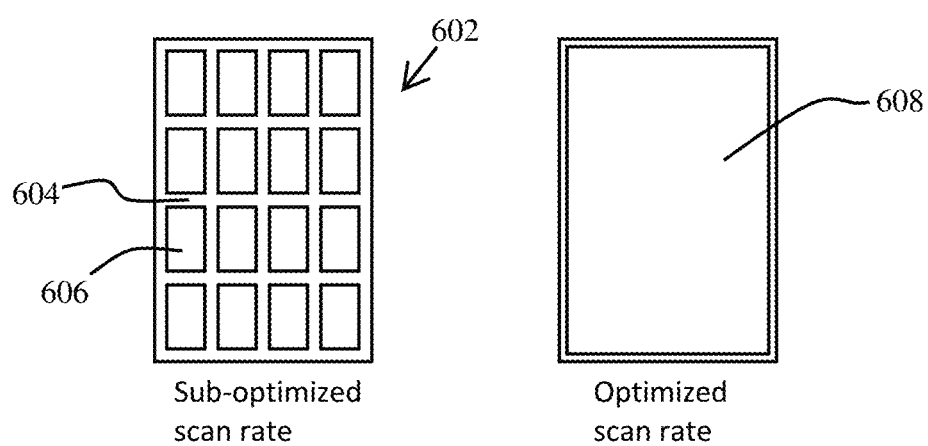
FIG. 6 is a depiction of a sub-optimized and optimized scan rates at a target surface.

Various beam shapers, homogenizers, diffusers, or diffractive, reflective, or refractive optical systems can be used to achieve suitable selected uniformities. Beam uniformities can be selected to be of different Gaussian order, including fourth order, eighth order, twelfth order, or higher. It will be appreciated that using Gaussian orders of eighth and higher can yield marked increases in process efficiency for laser lift-off. A beam scanner 710 rasters the square or rectangular optical pulses across the lift-off target surface 712 with a pre-determined or optimized amount of overlap between adjacent optical pulses, depiction of such optimization being shown in FIG. 6. The result 602 of a sub-optimized scan rate can cause lift-off inconsistency 604 or other mura effects between pulses 606 on the target 608. With optimized pulses, a scanned area 608 does not exhibit such deficiencies. A controller 714 is used to control the beam scanner to provide the scanned optical pulses in a predetermined pattern.

The scanned pattern can cover an entire area of the target 712, similar to conventional excimer line beam approaches, or the system 700 can be advantageously used to select particular areas of the target 712 for lift-off, the latter not being readily achievable with line beam approaches. The controller 714 can be linked to the solid state laser source 702 to provide feedback and communication between the beam scanner 710 and pulse generation. To perform lift-off at the target surface 712, the scanned optical pulses should have a fluence in the range of 100s of mJ/cm$^2$, preferably between 200 mJ/cm$^2$ and 300 mJ/cm$^2$. In a preferred example, the pulse energy generated by the solid state laser source is 14.4 mJ, a pulse repetition rate is 10 kHz, producing a square spot at the target surface that is 2.3 mm long on each side, and a fluence of 235 mJ/cm$^2$. The total delivered energy can be approximately 25% less than an excimer pulsed line beam approach but with approximately the same takt time, directly resulting in a more energy efficient, and therefore lower cost process without adversely affecting process speed. Such a relation is not expected given the shift from the formation of singular line pulses to forming lines with a series of square or rectangular pulses sequentially delivered to constitute the line.

Figure 1B:
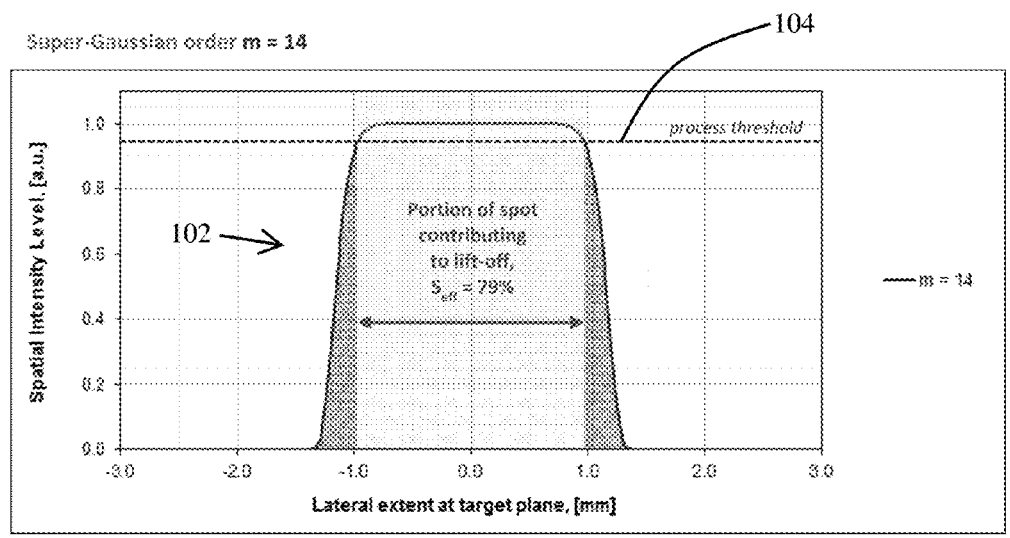
FIG. 1B is another chart of spatial intensity across an example laser pulse.

FIGS. 1A and 1B show charts of spatial intensity cross-sections 100, 102 of example optical pulses of equal total pulse energy delivered to a laser lift-off target surface. A laser lift-off process threshold intensity level 104 is selected to be 95% of peak intensity, with the intensity profiles normalized for clarity. Other process thresholds can be selected depending on the application parameters, the homogeneity of the pulses, or other system parameters. Cross-section 100 shows that uniformity across one transverse axis of a particular pulse is configured to have a super-Gaussian shape of the fourth order, it can be seen that 38% of the 1/e$^2$ width, amounting to about 52% of the pulse energy, is located at or above the process threshold required to cause lift-off at the surface. A remaining portion of the pulse energy is below the selected process threshold and resides in the tails 106 of the pulse.

In cross-section 102, uniformity is increased to a super-Gaussian shape of the fourteenth order, and it can be seen that 79% of the 1/e$^2$ width, amounting to about 85% of the pulse energy, is located at or above the process threshold required to cause lift-off at the target. The increase in energy above the process threshold 104 and decrease in energy below process threshold 104 results in a larger lateral extent of lift-off effective pulse energy at the target. This larger lateral extent corresponds to a larger portion of the laser pulse spot contributing to lift-off so that less of the pulse is wasted during processing and more of the target is processed with each pulse.

Figure 2A:
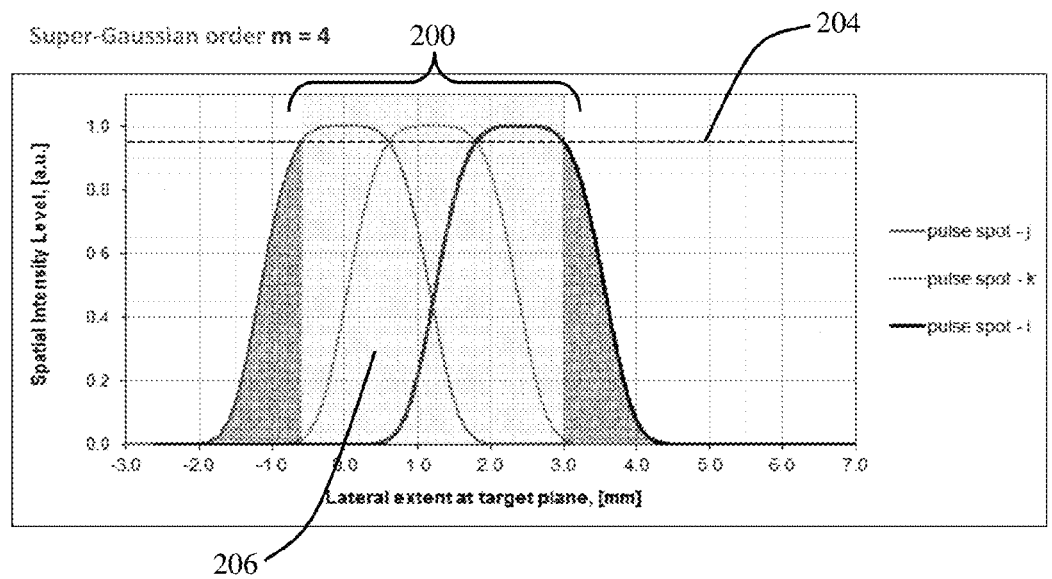
FIG. 2A is a chart of spatial intensity for scanned pulses.
Figure 2B:
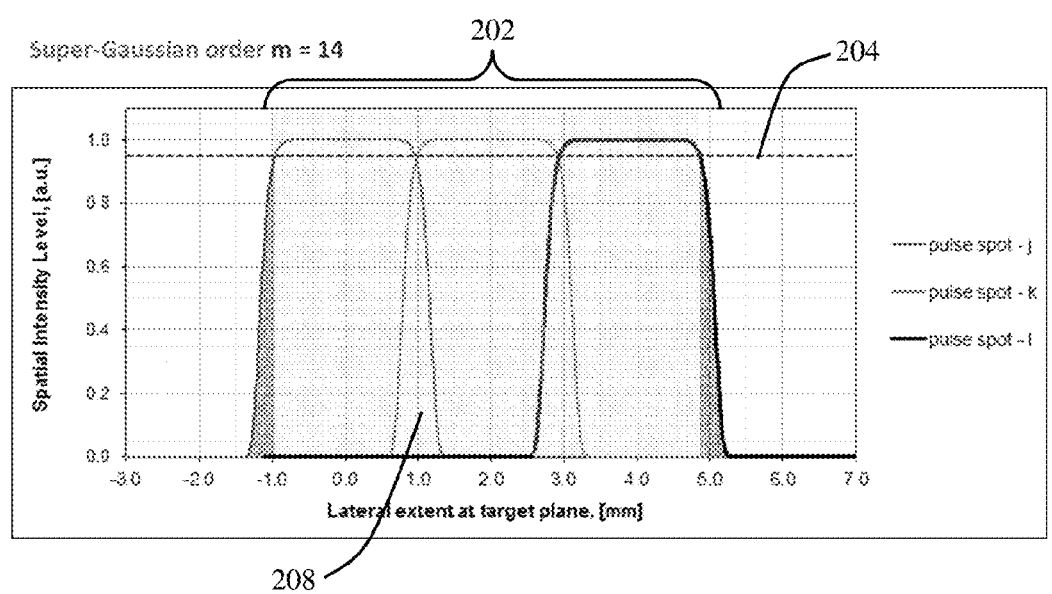
FIG. 2B is another chart of spatial intensity for scanned pulses.

FIGS. 2A and 2B are charts of spatial intensity cross-sections 200, 202 of multiple example optical pulses adjacently delivered by scanning optics to a lift-off target. Optical pulse spots are deposited with an overlap 206, 208 such that the target surface across the cross-section of the pulse is processed continuously above the selected 95% process threshold 204. A close approximation of the shape of the pulse in the scan direction for an excimer pulsed line laser system is a super-Gaussian shape of the fourth order. For such a shape, as depicted in FIG. 2A, subsequent optical pulses are deposited approximately 1 mm adjacent to a previous optical pulse to maintain process threshold 204. Portions of the optical pulses below the optical intensity process threshold 204 do not contribute to laser lift-off.

As depicted in FIG. 2B, cross-section 202 includes a series of optical pulses that have an increased uniformity with a super-Gaussian shape of the fourteenth order. Due to the higher uniformity, the distance between optical pulses can be increased while maintaining the target surface consistently above process threshold 204. In example 202, a 63% increase in scan rate can be achieved by using the higher order super-Gaussian as each subsequently delivered pulse is spaced further apart. Thus, the resulting increase in scan rate can allow faster takt times than excimer-type systems for processing the same target.

Figure 3:
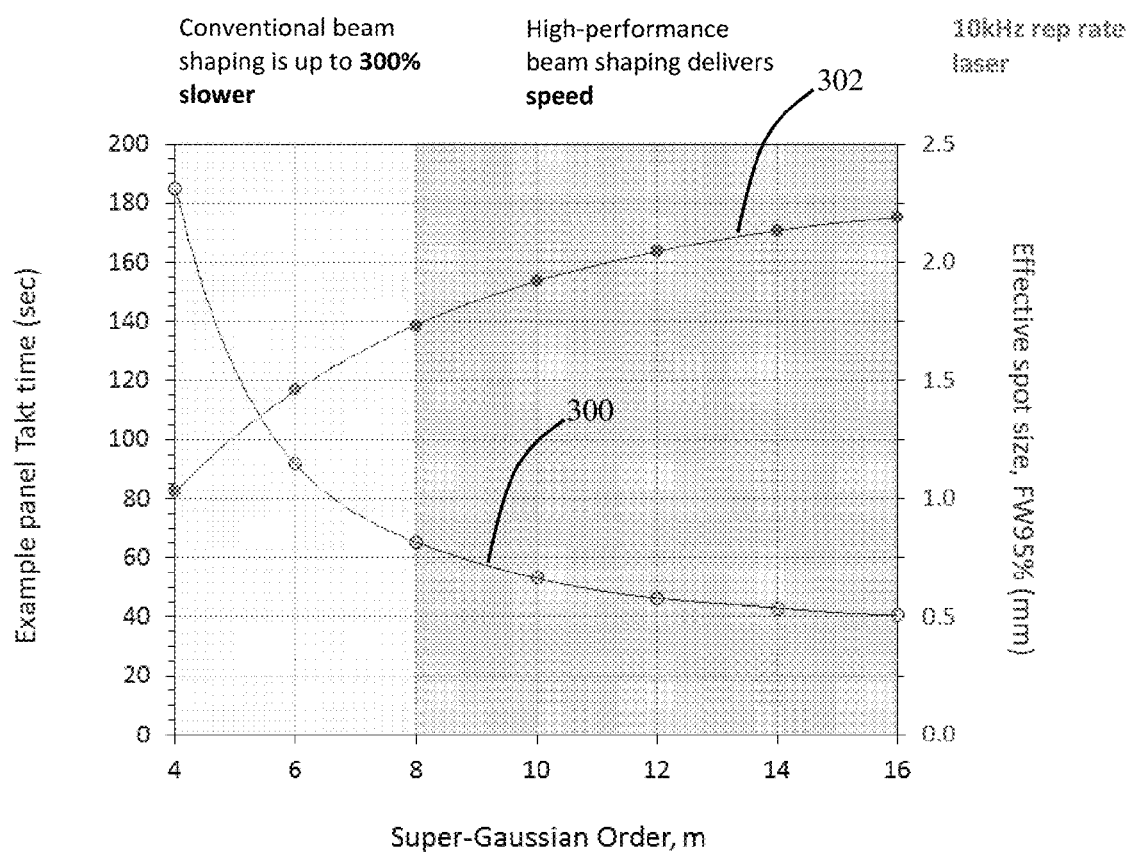
FIG. 3 is a chart of processing takt time and spot size versus pulse shape super Gaussian order.

FIG. 3 is a graphical example of how takt time for processing flexible panels with laser lift-off can be reduced by adjusting the super-Gaussian order of square optical pulses. With line 300, example takt time for laser lift-off processing with a series of pulses is plotted against increasing super-Gaussian order, demonstrating a decrease in processing time as the uniformity of the beam increases. With line 302, effective spot size of the optical pulses is plotted against increasing super-Gaussian order, demonstrating a larger effective spot size at the laser lift-off target surface as the uniformity of the beam increases. With a selected pulse repetition rate of 10 kHz a conventional laser system using a super-Gaussian of the fourth order is about three times slower than solid state source examples herein using beam shaping for pulses achieving super-Gaussian shapes of eighth order or larger. As can be seen from the chart, this result is counterintuitive since the effective spot size for the same pulse increases by less than 100% over the same super-Gaussian order increase.

Figure 4A:
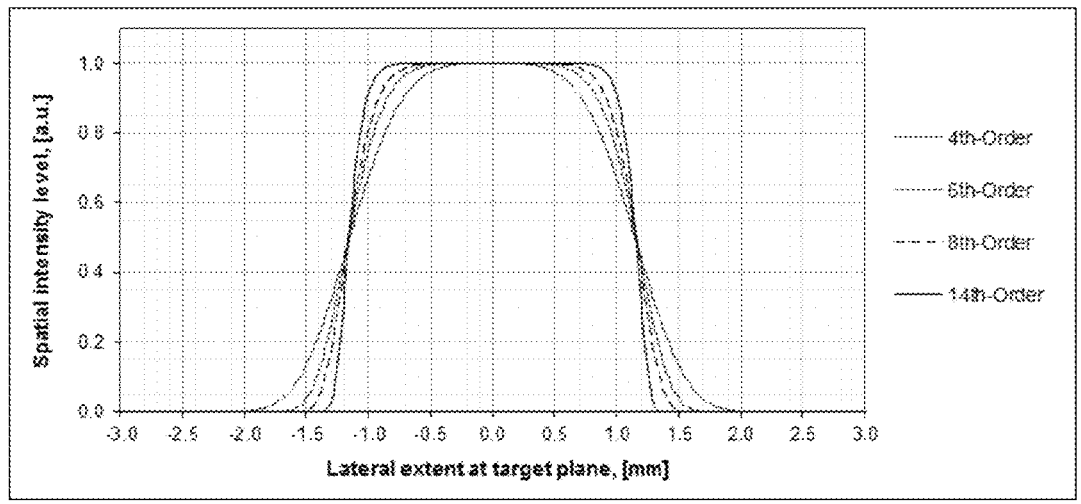
FIG. 4A is a chart of spatial intensity across a laser pulse for different super Gaussian orders.
Figure 4B:
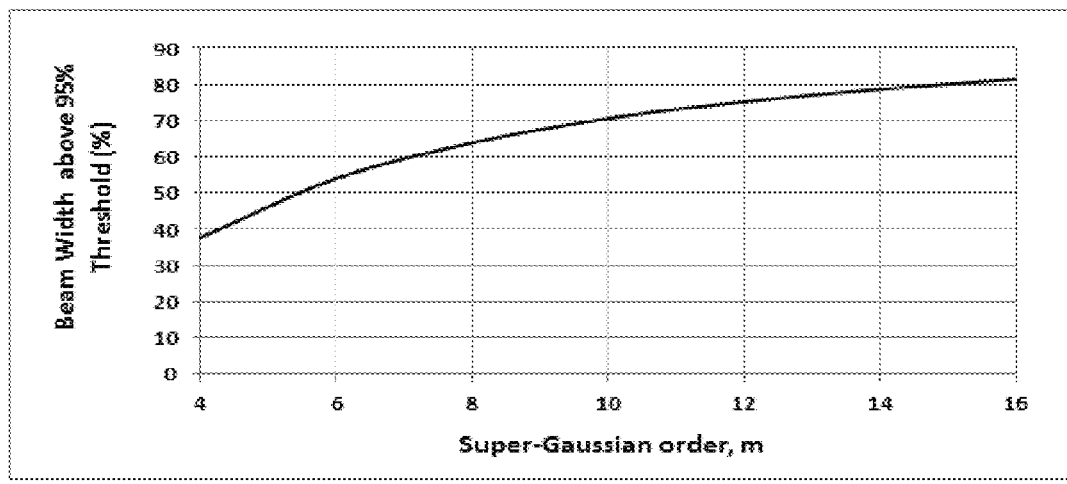
FIG. 4B is a chart of beam content versus super Gaussian order.

FIG. 4A shows the normalized spatial intensity distribution of a cross-section of an optical pulse for different super-Gaussian orders. FIG. 4B shows how the percentage of beam width at a lift-off target and above a particular lift-off process threshold increases as a function of super-Gaussian order.

In view of the many possible embodiments to which the principles of the disclosed invention may be applied, it should be recognized that the illustrated embodiments are only preferred examples of the invention and should not be taken as limiting the scope of the disclosure. We therefore claim all that comes within the scope and spirit of these claims.

I claim:

1. A laser lift-off method comprising:
generating a plurality of solid state laser pulses;
converting the plurality of solid state laser pulses to an ultraviolet frequency;
adjusting the transverse spatial intensity profile of the plurality of laser pulses across perpendicular transverse axes to be rectangular in shape with the shape along each transverse axis corresponding to a super-Gaussian of order eight or higher; and
scanning the plurality of laser pulses across the target along a direction parallel to one of the transverse axes in order to produce laser lift-off on the target.

2. The method of claim 1 wherein the rectangular shape is a square shape.

3. The method of claim 1 wherein the spatial extent of the scanned laser pulses at the target overlap each other by less than 20%.

4. The method of claim 1 wherein the adjusted transverse spatial intensity profile across each of the perpendicular transverse axes corresponding to a super-Gaussian of order of at least twelve.

5. The method of claim 1 wherein the length of the pulses in the scan direction at the target is at least 1.5 mm or longer.

6. The method of claim 1 wherein the laser pulses delivered to the target each have a pulse fluence of at least 200 mJ/cm$^2$.

7. The method of claim 1 wherein a pulse repetition rate of the pulses delivered to the target is at least 10 kHz.

8. The method of claim 1 wherein the solid state laser pulses are generated with a solid state disk laser.

9. The method of claim 1 wherein an aspect ratio of the rectangular pulse is 5:1 or less.

10. A system for causing laser lift-off on a target, the system comprising:
a pulsed solid state laser situated to produce laser pulses having laser pulse parameters selected for laser lift-off;
frequency converter situated to receive the laser pulses and to convert the frequency of the laser pulses;
beam shaping optics situated to receive the laser pulses and to adjust the transverse intensity profile of the laser pulses across perpendicular transverse axes such that the shape of the profile across each transverse axis corresponds to a super-Gaussian of order eight or higher; and
scanning optics situated to direct the spatially adjusted laser pulses to the target along a direction parallel to one of the transverse axes in order to cause laser lift-off on the target.

11. The system of claim 10 wherein the frequency converter converts the laser pulses to an ultraviolet frequency.

12. The system of claim 10 wherein the shape of the adjusted transverse intensity profile is a rectangular shape.

13. The system of claim 12 wherein the rectangular shape has an aspect ratio of 5:1 or less.

14. The system of claim 10 wherein the length of the optical pulses in the scan direction at the target surface is 1.5 mm or wider.

15. The system of claim 10 wherein the laser pulses have a pulse fluence at the target surface of of 200 mJ/cm$^2$ or more.

16. The system of claim 10 wherein the pulsed solid state laser is a disk laser.

17. The system of claim 10 wherein the pulsed solid state laser is a rod laser.

18. The system of claim 10 wherein the adjusted transverse spatial intensity profile across each of the perpendicular transverse axes corresponds to a super-Gaussian of order of at least twelve.

19. The system of claim 10 wherein the adjusted transverse spatial intensity profile across each of the perpendicular transverse axes corresponds to a super-Gaussian of order of at least fourteen.

20. The system of claim 10 wherein the laser pulses are provided to the target surface at a pulse repetition rate of at least 10 kHz.

* * * * *